(12) United States Patent
Summers et al.

(10) Patent No.: US 10,186,497 B2
(45) Date of Patent: Jan. 22, 2019

(54) TECHNIQUES AND CONFIGURATIONS TO CONTROL MOVEMENT AND POSITION OF SURFACE MOUNTED ELECTRICAL DEVICES

(71) Applicant: Intel Corporation, Santa Clara, CA (US)

(72) Inventors: Mark D. Summers, Phoenix, AZ (US); Kuang C. Liu, Queen Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/495,581

(22) Filed: Apr. 24, 2017

(65) Prior Publication Data
US 2017/0229420 A1 Aug. 10, 2017

Related U.S. Application Data

(62) Division of application No. 14/491,646, filed on Sep. 19, 2014, now Pat. No. 9,647,363.

(51) Int. Cl.
*B23K 31/02* (2006.01)
*H01L 23/00* (2006.01)
(Continued)

(52) U.S. Cl.
CPC .............. *H01L 24/81* (2013.01); *B23K 1/008* (2013.01); *B23K 1/0016* (2013.01); *H01L 24/13* (2013.01);
(Continued)

(58) Field of Classification Search
CPC .. H01R 12/718; H01R 12/7076; H01R 13/22; H01L 23/49827; H01L 23/49811;
(Continued)

(56) References Cited

U.S. PATENT DOCUMENTS 4,657,172 A * 4/1987 Lee ...................... H05K 3/3426
228/180.21
4,673,967 A * 6/1987 Hingorany .......... H01L 23/3107
257/696
(Continued)

FOREIGN PATENT DOCUMENTS

JP 2005061978 A * 3/2005

OTHER PUBLICATIONS

Non-Final Office Action dated Sep. 7, 2016 for U.S. Appl. No. 14/491,646, 10 pages.
(Continued)

*Primary Examiner* — Kiley S Stoner
(74) *Attorney, Agent, or Firm* — Schwabe, Williamson & Wyatt, P.C.

(57) ABSTRACT

Embodiments of the present disclosure are directed towards techniques and configurations to control movement and position of surface mounted electrical devices. In one embodiment, an electrical contact includes a leg portion configured to extend in a first direction, a foot portion coupled with the leg portion, the foot portion having a surface that extends in a second direction that is substantially perpendicular to the first direction, the surface being configured to directly couple with solderable material to form a solder joint, a heel portion adjoining the leg portion and the foot portion, the heel portion having a profile shape, and a toe portion extending from the foot portion and disposed opposite to the heel portion, the toe portion having a profile shape that is symmetric with the profile shape of the heel portion. Other embodiments may be described and/or claimed.

17 Claims, 4 Drawing Sheets

(51) Int. Cl.
  *B23K 1/00* (2006.01)
  *B23K 1/008* (2006.01)
  *B23K 101/40* (2006.01)

(52) U.S. Cl.
  CPC .......... *H01L 24/16* (2013.01); *B23K 2101/40* (2018.08); *H01L 2224/13023* (2013.01); *H01L 2224/1616* (2013.01); *H01L 2224/81143* (2013.01); *H01L 2224/81815* (2013.01); *H01L 2924/15323* (2013.01)

(58) Field of Classification Search
  CPC ............. H01L 23/147; H01L 23/49816; H01L 2924/0002; H01L 24/81; H01L 24/16; H01L 24/13; H01L 2224/1616; H01L 2224/81815; H01L 2224/81143; H01L 2924/15323; H01L 2224/13023; B23K 1/0016; B23K 2201/38; B23K 1/008; B23K 2201/36–2201/42; Y02P 70/613; H05K 2201/10325; H05K 3/3426
  USPC .................. 228/179.1–180.22, 245–246; 257/737–738; 438/613–616
  See application file for complete search history.

(56) References Cited

U.S. PATENT DOCUMENTS

| | | | | |
|---|---|---|---|---|
| 4,720,034 A * | 1/1988 | Lee | ................ | H05K 3/3426 118/423 |
| 4,948,030 A * | 8/1990 | Chason | ................ | B23K 1/20 228/118 |
| 5,023,916 A * | 6/1991 | Breu | ................ | B23K 31/12 348/126 |
| 5,055,912 A * | 10/1991 | Murasawa | ........ | H01L 23/49555 257/696 |
| 5,241,134 A * | 8/1993 | Yoo | ................ | H01L 23/49541 174/259 |
| 5,351,393 A * | 10/1994 | Gregoire | .......... | H01L 23/49555 257/E23.048 |
| 5,375,320 A * | 12/1994 | Kinsman | ........... | H05K 13/0092 174/555 |
| 5,549,240 A * | 8/1996 | Urban | ................ | B23K 1/018 228/19 |
| 5,836,071 A * | 11/1998 | Falcone | ................ | H01L 24/48 29/593 |
| 5,880,520 A * | 3/1999 | Ma | ................ | H01L 23/495 257/659 |
| 5,964,395 A * | 10/1999 | Glovatsky | ......... | B23K 35/0222 228/123.1 |
| 6,025,642 A * | 2/2000 | Burns | ................ | H01L 21/565 257/686 |
| 6,028,352 A * | 2/2000 | Eide | ................ | H01L 23/49537 257/398 |
| 6,081,416 A * | 6/2000 | Trinh | ................ | H01G 4/12 361/308.1 |
| 6,114,759 A * | 9/2000 | Okuaki | ................ | H01L 23/49555 257/692 |
| 6,246,011 B1 * | 6/2001 | Abraham | ................ | H05K 1/0243 174/260 |
| 6,903,920 B1 * | 6/2005 | Prymak | ................ | H01G 2/065 361/306.1 |
| 7,448,877 B1 | 11/2008 | Pennypacker et al. | | |
| 7,633,739 B2 * | 12/2009 | Devoe | ................ | H01G 4/232 361/306.3 |
| 7,964,956 B1 * | 6/2011 | Bet-Shliemoun | ................ | H01L 23/49811 257/694 |
| 8,289,675 B2 * | 10/2012 | Devoe | ................ | H01G 4/232 361/306.1 |
| 9,106,005 B2 * | 8/2015 | Okuyama | ................ | H01R 4/028 |
| 2002/0162679 A1 * | 11/2002 | Hannan | ................ | H01L 21/563 174/528 |
| 2003/0062601 A1 * | 4/2003 | Harnden | ................ | H01L 23/3107 257/666 |
| 2005/0103521 A1 * | 5/2005 | Vinciarelli | ................ | H01R 12/57 174/260 |
| 2005/0124187 A1 | 6/2005 | Olson et al. | | |
| 2005/0127494 A1 * | 6/2005 | Liu | ................ | H01L 23/3107 257/696 |
| 2006/0145313 A1 * | 7/2006 | Lee | ................ | H01L 21/565 257/666 |
| 2006/0244344 A1 * | 11/2006 | Tanaka | ................ | H03B 5/36 310/344 |
| 2008/0070447 A1 | 3/2008 | Deng et al. | | |
| 2008/0239621 A1 * | 10/2008 | Tajuddin | ................ | H01G 2/06 361/306.1 |
| 2008/0297985 A1 * | 12/2008 | Fjelstad | ................ | H05K 1/144 361/600 |
| 2009/0032915 A1 * | 2/2009 | Cherian | ................ | H01L 21/4853 257/666 |
| 2009/0325398 A1 | 12/2009 | Ma et al. | | |
| 2010/0188798 A1 * | 7/2010 | Togashi | ................ | H01G 2/06 361/306.3 |
| 2010/0243307 A1 * | 9/2010 | McConnell | ............ | H01G 4/232 174/260 |
| 2011/0074047 A1 | 3/2011 | Pendse | | |
| 2011/0292567 A1 * | 12/2011 | McConnell | .......... | B23K 1/0016 361/321.2 |
| 2013/0107419 A1 * | 5/2013 | Hill | ................ | H01G 4/008 361/305 |
| 2013/0284501 A1 * | 10/2013 | McConnell | .......... | H05K 1/0271 174/255 |
| 2014/0002952 A1 * | 1/2014 | McConnell | .......... | B23K 1/0016 361/301.4 |
| 2015/0287670 A1 * | 10/2015 | Fukase | ................ | H05K 1/186 361/772 |
| 2017/0025223 A1 * | 1/2017 | Bultitude | ................ | H01G 4/30 |

OTHER PUBLICATIONS

Notice of Allowance dated Jan. 19, 2017 for U.S. Appl. No. 14/491,646, 10 pages.

* cited by examiner

TECHNIQUES AND CONFIGURATIONS TO CONTROL MOVEMENT AND POSITION OF SURFACE MOUNTED ELECTRICAL DEVICES

CROSS REFERENCE TO RELATED APPLICATION

The present application is a divisional of U.S. patent application Ser. No. 14/491,646, filed Sep. 19, 2014, entitled "TECHNIQUES AND CONFIGURATIONS TO CONTROL MOVEMENT AND POSITION OF SURFACE MOUNTED ELECTRICAL DEVICES," the entire disclosure of which is hereby incorporated by reference in its entirety.

FIELD

Embodiments of the present disclosure generally relate to the field of integrated circuits, and more particularly, to techniques and configurations to control movement and position of surface mounted electrical devices.

BACKGROUND

Currently, electrical components may be coupled with a substrate such as a circuit board using Surface Mount Technology (SMT). For example, a solder reflow process may be used to form solder joints between corresponding electrical contacts on a socket assembly and a circuit board. Emerging socket assemblies may include multiple, discrete components that are coupled with the circuit board by solder joints. However, during a solder reflow process to couple such discrete components with the circuit board, molten solderable material may wick or wet the electrical contact surfaces of the socket assembly or circuit board in a manner that causes repositioning between the individual components of the socket assembly relative to one another. The repositioning may cause misalignment between the socket assembly components and the circuit board resulting in solder joint defects such failure to make electrical contact between the socket assembly and the circuit board.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations to control movement and position of surface mounted electrical devices. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1:
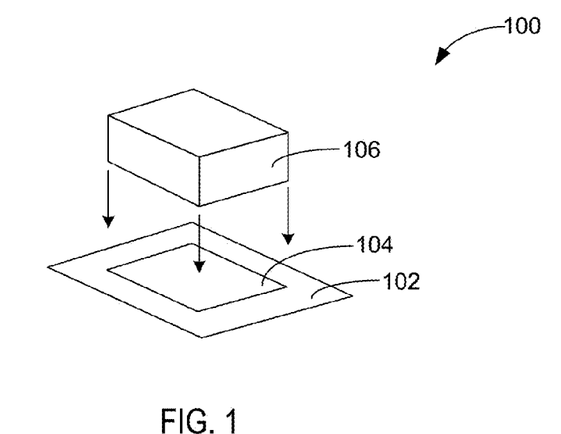
FIG. 1 schematically illustrates a perspective view of an example integrated circuit (IC) package assembly, in accordance with some embodiments.

FIG. 1 schematically illustrates a perspective view of an example integrated circuit (IC) package assembly 100, in accordance with some embodiments. The IC package assembly 100 may include a socket assembly 104 coupled with a circuit board or other suitable electronic substrate ("hereinafter circuit board 102"). The IC package assembly 100 may further include a die or die package (hereinafter "die package 106") electrically coupled with the circuit board 102 through the socket assembly 104.

The socket assembly 104 may include, for example, a land-grid array (LGA) socket having an array of electrical contacts that are configured to route electrical signals between the die package 106 and the circuit board 102. According to various embodiments, the electrical contacts of the socket assembly 104 may comport with embodiments described herein. For example, in some embodiments, the electrical contacts of the socket assembly may comport with embodiments described in connection with FIGS. 5a-b and FIG. 6 to control movement and position of the socket assembly 104 relative to the circuit board 102. The socket assembly 104 may comport with embodiments described in connection with FIGS. 2-3.

In some embodiments, the circuit board 102 may be a printed circuit board (PCB) composed of an electrically insulative material such as an epoxy laminate. The circuit board 102 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die package 106 through the circuit board 102. The circuit board 102 may be composed of other suitable materials in other embodiments. For example, in some embodiments, the circuit board 102 is an epoxy-based laminate substrate having a core and/or build-up layers such as, for example, an Ajinomoto Build-up Film (ABF) substrate. In some embodiments, the circuit board 102 is a motherboard (e.g., motherboard 802 of FIG. 8).

The die package 106 may include one or more dies in any of a wide variety of suitable configurations. For example, the die package 106 may be a central processing unit (CPU) package in one embodiment. The die package 106 may include one or more dies that are encapsulated, at least partially, in a protective enclosure such as, for example, a mold compound or other suitable protective housing. In some embodiments, the die package 106 may include alignment features to facilitate coupling of the die package 106 with corresponding features of the socket assembly 104.

The die package 106 may include one or more dies made from a semiconductor material (e.g., silicon) and having circuitry formed using semiconductor fabrication techniques such as thin film deposition, lithography, etching and the like used in connection with forming CMOS devices. In some embodiments, the one or more dies of the die package 106 may be, include, or be a part of a processor, memory, SoC or ASIC. The one or more dies in the die package 106 may include a wide variety of configurations including, for example, suitable combinations of flip-chip and/or wire-bonding configurations, interposers, multi-chip package configurations including system-in-package (SiP) and/or package-on-package (PoP) configurations.

Figure 2:
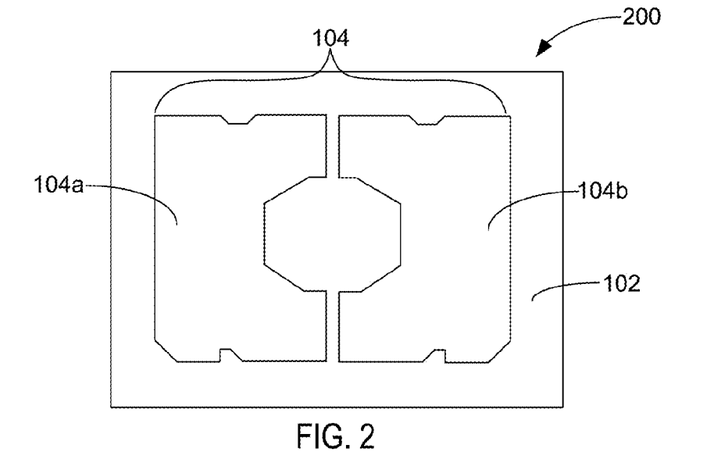
FIG. 2 schematically illustrates a top view of an IC package assembly, in accordance with some embodiments.

FIG. 2 schematically illustrates a top view of an IC package assembly 200, in accordance with some embodiments. The IC package assembly 200 may include a circuit board 102 and a socket assembly 104 coupled with the circuit board 102 using a plurality of electrical contacts.

In some embodiments, the socket assembly 104 may be composed of two or more discrete portions (e.g., physically separate from one another prior to coupling to the circuit board 102 and, in some cases, after coupling to the circuit board 102). For example, in the depicted embodiment, the socket assembly 104 includes a first portion 104a and a second portion 104b, each of which may be coupled with the circuit board 102 using electrical contacts as described herein. In other embodiments, the socket assembly 104 may include more discrete portions than depicted.

Figure 3:
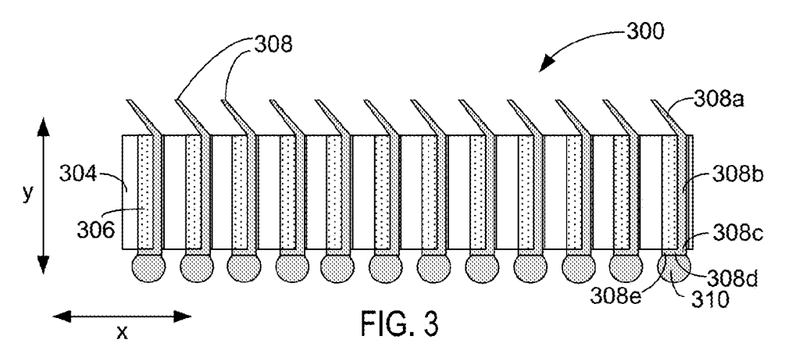
FIG. 3 schematically illustrates a cross-section side view of a substrate with electrical contacts, in accordance with some embodiments.

FIG. 3 schematically illustrates a cross-section side view of a substrate 304 with electrical contacts 308, in accordance with some embodiments. The substrate 304 may represent a portion of the socket assembly 104 of FIGS. 1-2 in some embodiments. In other embodiments, the substrate 304 may represent a substrate of another suitable electronic assembly (e.g., interposer, die package substrate, optics, connectors, etc.).

In some embodiments, the substrate 304 may include a plurality of openings 306 disposed between a first side and opposing second side of the substrate 304, as can be seen. The electrical contacts 308 may be physically coupled with the substrate 304 in corresponding openings of the plurality of openings 306. For example, the electrical contacts 308 may be physically coupled with the substrate 304 using mechanical stitching features. In some embodiments, the electrical contacts 308 may extend through the openings 306 to route electrical signals such as, for example, input/output (I/O) signals or power/ground of a die (e.g., die package 106 of FIG. 1), through the substrate 304.

The substrate 304 may be composed of any of a wide variety of suitable materials including, for example polymers, ceramics or semiconductor materials. The substrate 304 may be composed of other suitable materials in other embodiments.

The electrical contacts 308 may be leads of an LGA socket configuration in some embodiments. For example, the electrical contacts 308 may be J-leads, which may be so named because, from a side view, each of the J-leads may have a profile resembling the letter J, as can be seen. The electrical contacts 308 may be composed of an electrically conductive material such as metal.

In some embodiments, each of the electrical contacts 308 may have a contact portion 308a, a leg portion 308b, a heel portion 308c, a foot portion 308d and a toe portion 308e, as can be seen. The contact portion 308a may extend beyond a surface of the substrate 304 to make electrical contact with corresponding interconnect features on a die package (e.g., die package 106 of FIG. 1). The leg portion 308b may extend through the openings 306. The heel portion 308c may adjoin the leg portion 308b and the foot portion 308d. The foot portion 308d (sometimes referred to as "paddle") may have a surface that is configured to directly coupled with solderable material 310 (e.g., solder ball) to form a solder joint (e.g., between a socket assembly 104 and a circuit board 102 of FIGS. 1-2). The toe portion 308d may be a terminating end of the foot portion 308d opposite to the heel portion 308c.

In some embodiments, the leg portion 308b may extend in a first direction, indicated by x-axis, and the foot portion 308d may include a surface that extends in a second direction, indicated by y-axis, that is perpendicular to the first direction, as can be seen. In various embodiments, the leg portion 308b may extend away from the surface of the foot portion 308d at an angle that is substantially perpendicular (e.g., +/−10° of being perpendicular).

In some embodiments, the electrical contacts 308 may comport with embodiments described in connection with FIGS. 5a-b. For example, in some embodiments, the toe portion 308e may have a profile shape that is symmetric with a profile shape of the heel portion 308c. The profile shape of the electrical contacts 308 is merely one example and may include any of a wide variety of other profile shapes in other embodiments.

Figure 4A:
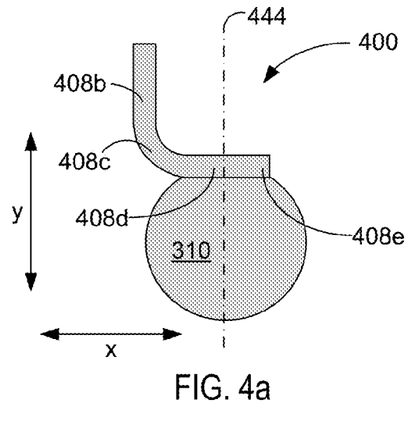
FIGS. 4a-4b schematically illustrate a cross-section side view of position of an electrical contact relative to solderable material during solder joint formation, in accordance with some embodiments.
Figure 4B:
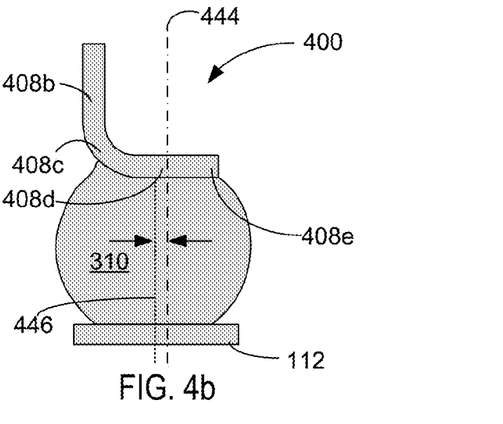

FIGS. 4a-4b schematically illustrate a cross-section side view of position of an electrical contact 400 relative to solderable material 310 during solder joint formation, in accordance with some embodiments. The electrical contact 400 may include a leg portion 408b, heel portion 408c, foot portion 408d and toe portion 408e, coupled as can be seen.

FIG. 4a may represent the electrical contact 400 after depositing solderable material 310 onto a surface of the foot portion 408d, as can be seen. An original position of a center of mass of the solderable material 310 is represented by line 444.

FIG. 4b may represent the electrical contact 400 during or subsequent to performing a solder ball reflow process to form a solder joint between the electrical contact 400 and a pad 112 or other electrical contact disposed on an electronic substrate (e.g., circuit board 102 of FIGS. 1-2) using the solderable material 310. During the solder reflow process, the solderable material 310 may wick or wet up the heel portion 408c of the electrical contact 400, which may shift the center of mass of the solderable material 310 toward the heel portion 408c to a post-reflow position represented by line 446, as can be seen. Because the center of mass of mass of the solderable material 310 wants to be centered at a center of the pad 112, the electrical contact 400 may move to the right in relation to the pad 112 (e.g., towards the toe portion 408e). Such movement of the electrical contact 400 when combined with other electrical contacts 400 that are similarly configured may move an entire socket assembly (e.g., socket assembly 104 of FIG. 1 or first portion 104a/second portion 104b of FIG. 2) in a same direction as the electrical contact 400 (e.g., to the right in the depicted embodiment).

Figure 5A:
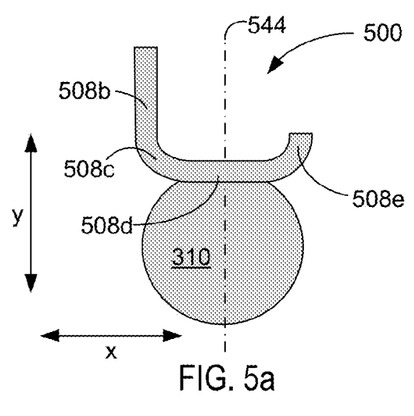
FIGS. 5a-5b schematically illustrate a cross-section side view of position of an electrical contact relative to solderable material during solder joint formation, in accordance with some embodiments.
Figure 5B:
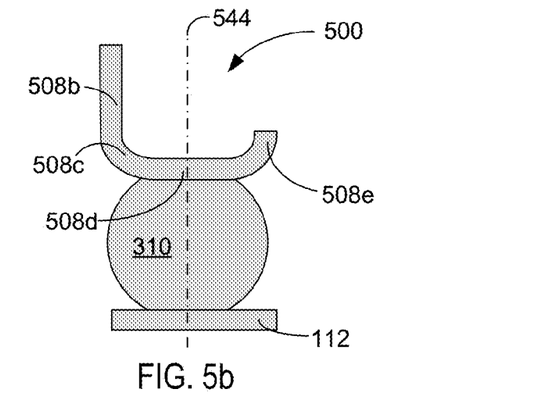

FIGS. 5a-5b schematically illustrate a cross-section side view of position of an electrical contact 500 relative to solderable material 310 during solder joint formation, in accordance with some embodiments. The electrical contact 500 may include a leg portion 508b, heel portion 508c, foot portion 508d and toe portion 508e, coupled as can be seen.

Principles of solder wicking movement described in connection with FIGS. 4a-4b may be used to control (e.g., mitigate or steer) movement of the electrical contact 500 relative to the pad 112. For example, FIG. 5a may represent the electrical contact 500 after depositing solderable material 310 onto a surface of the foot portion 508d, as can be seen. The solderable material 310 may generally center on the flat surface of the foot portion 508d. An original position of a center of mass of the solderable material 310 is represented by line 544.

The toe portion 508e may be configured with a profile shape that symmetrically matches the profile shape of the heel portion 508c. For example, in the depicted embodiment, the toe portion 508e may curve and point upwards (e.g., in the direction of the y-axis) in a mirror-image of the heel portion 508c across the original position of the center of mass, which may correspond with a center (e.g., in the direction of the x-axis) of the flat surface of the foot portion 508d as can be seen. The toe portion 508e may include a wicking surface that matches the wicking surface of the heel portion 408c.

FIG. 5b may represent the electrical contact 500 during or subsequent to performing a solder ball reflow process to form a solder joint between the electrical contact 500 and a pad 112 or other electrical contact disposed on an electronic substrate (e.g., circuit board 102 of FIGS. 1-2) using the solderable material 310. During the solder reflow process, the solderable material 310 may want to equally wick or wet up the heel portion 508c and the toe portion 508e of the electrical contact 400, which may stop or prevent movement of the electrical contact 500 relative to the pad 112 as described in connection with FIG. 4b.

In some embodiments, a radius of the curve of the heel portion 408c and the toe portion 408e may have a radius that is equal to or greater than three times the thickness of the electrical contact. The heel portion 508c and the toe portion 508e may have other suitable profile shapes that are symmetrical.

Figure 6:
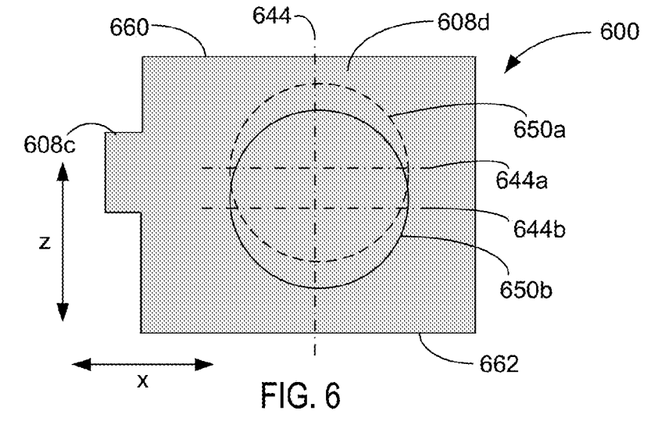
FIG. 6 schematically illustrates a bottom view of position of an electrical contact relative to solderable material during solder joint formation, in accordance with some embodiments.

FIG. 6 schematically illustrates a bottom view of position of an electrical contact 600 relative to solderable material during solder joint formation, in accordance with some embodiments. The electrical contact 600 may include at least a heel portion 608c and foot portion 608d. In some embodiments, the electrical contact 600 may further include a toe portion (e.g., toe portion 508e) as described in connection with FIGS. 5a-b.

The electrical contact is described in reference to a z-axis and x-axis. The z-axis may extend in a direction that is perpendicular or substantially perpendicular to the x-axis and y-axis of FIGS. 3, 4a, and 5a. The x-axis represents a same direction as described in FIGS. 3, 4a, and 5a.

As can be seen, a first portion of the surface of the foot portion 608d extends up in the direction of the z-axis relative to the heel portion 608c and a second portion of the surface of the foot portion 608d extends down in the direction of the z-axis relative to the heel portion 608c. A distance between a terminating edge 660 of the first portion and the heel portion 608c may be greater than a distance between a terminating edge 662 of the second portion and the heel portion 608c, as can be seen. Such asymmetric configuration of the first portion relative to the second portion may cause a center of mass of a solderable material to shift towards the second portion.

For example, line 644 and 644a may intersect at a point that represents a center of mass of solderable material if the first portion and the second portion of the foot portion 608d are equidistant from the heel portion 608c (e.g., the second portion extends the same distance relative to the heel portion 608c as shown for the first portion in FIG. 6). A contact area of the solderable material on the surface of the foot portion 608d in such embodiment may be represented by line 650a.

However, in the case where the second portion extends further in the z-axis relative to the heel portion 608c than the first portion, as depicted, a center of mass of the solderable material may shift down in the z-direction towards the second portion to center on the surface of the foot portion 608d. For example, line 644 and 644b may intersect at a point that represents a center of mass of solderable material for such embodiment and a contact area of the solderable material on the surface of the foot portion 608d may be represented by line 650b.

These principles may be used to design electrical contacts to control movement during solder reflow. Controlling the movement of the electrical contact 600 may allow mitigation of misalignment of a socket assembly (e.g., socket assembly 104 of FIGS. 1-2) that may be caused by any undesired movement. For example, if upward movement in the z-direction of the electrical contact 600 (e.g., or a socket assembly including the electrical contact 600) is desired, then the configuration of the electrical contact 600 would provide such movement because as the center of mass of the solderable material shifts down in the z-axis direction, a resultant movement of the foot portion 608d upward in the z-direction would result because a center of mass of the solderable material would preferentially align towards a center of a corresponding pad (e.g., pad 112 of FIG. 5b).

Figure 7:
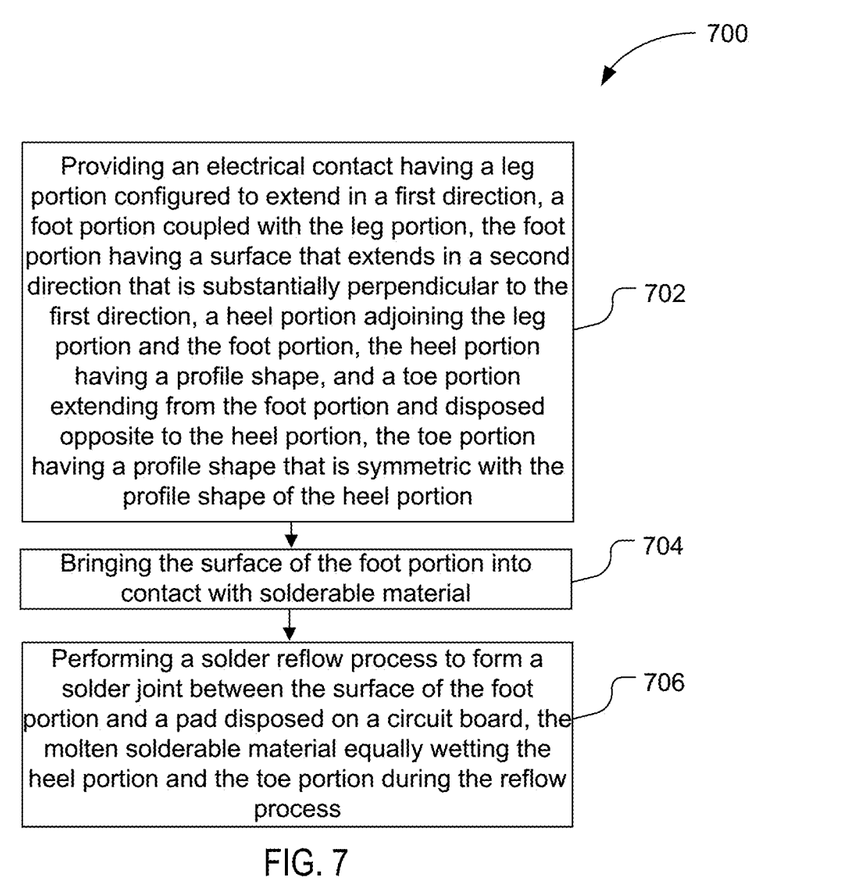
FIG. 7 schematically illustrates a flow diagram for a method of fabricating an IC package assembly, in accordance with some embodiments.

FIG. 7 schematically illustrates a flow diagram for a method 700 of fabricating an IC package assembly (e.g., IC package assembly 100 or 200 of respective FIG. 1 or 2), in accordance with some embodiments. The method 700 may comport with embodiments described in connection with FIGS. 1-6.

At 702, the method 700 may include providing an electrical contact (e.g., electrical contact 500 of FIGS. 5a-b) having a leg portion (e.g., leg portion 508b of FIGS. 5a-b) configured to extend in a first direction (e.g., y-axis direction of FIGS. 5a-b), a foot portion (e.g., foot portion 508d of FIGS. 5a-b) coupled with the leg portion, the foot portion having a surface that extends in a second direction (e.g., x-axis direction of FIGS. 5a-b) that is substantially perpendicular to the first direction, a heel portion (e.g., heel portion 508c of FIGS. 5a-b) adjoining the leg portion and the foot portion, the heel portion having a profile shape, and a toe portion (e.g., toe portion 508e of FIGS. 5a-b) extending from the foot portion and disposed opposite to the heel portion, the toe portion having a profile shape that is symmetric with the profile shape of the heel portion. In some embodiments, the electrical contact may further include an arrangement as described in connection with FIG. 6.

At 704, the method 700 may include bringing the surface of the foot portion into contact with solderable material (e.g., solderable material 310) of FIGS. 5a-b. In some embodiments, the solderable material may include solder balls that are deposited on the surface of the foot portion. A first solder reflow process may be performed to form a solder connection between the solderable material and the surface of the foot portion. In other embodiments, the solderable material may be deposited on a pad of a circuit board using a first reflow process and the solderable material may be brought into solderable contact with the surface of the foot portion in preparation for a second reflow process.

At 706, the method 700 may include performing a solder reflow process to form a solder joint between the surface of the foot portion and a pad (e.g., pad 112 of FIGS. 5a-b) disposed on a circuit board (e.g., circuit board 102 of FIGS. 1-2), the molten solderable material equally wetting the heel portion and the toe portion during the reflow process. The solder reflow process may be a second reflow process relative to a first reflow process performed at 704 to couple the solderable material with the surface of the foot portion or the pad of the circuit board as described. Various operations are described as multiple discrete operations in turn, in a manner that is most helpful in understanding the claimed subject matter. However, the order of description should not be construed as to imply that these operations are necessarily order dependent.

Figure 8:
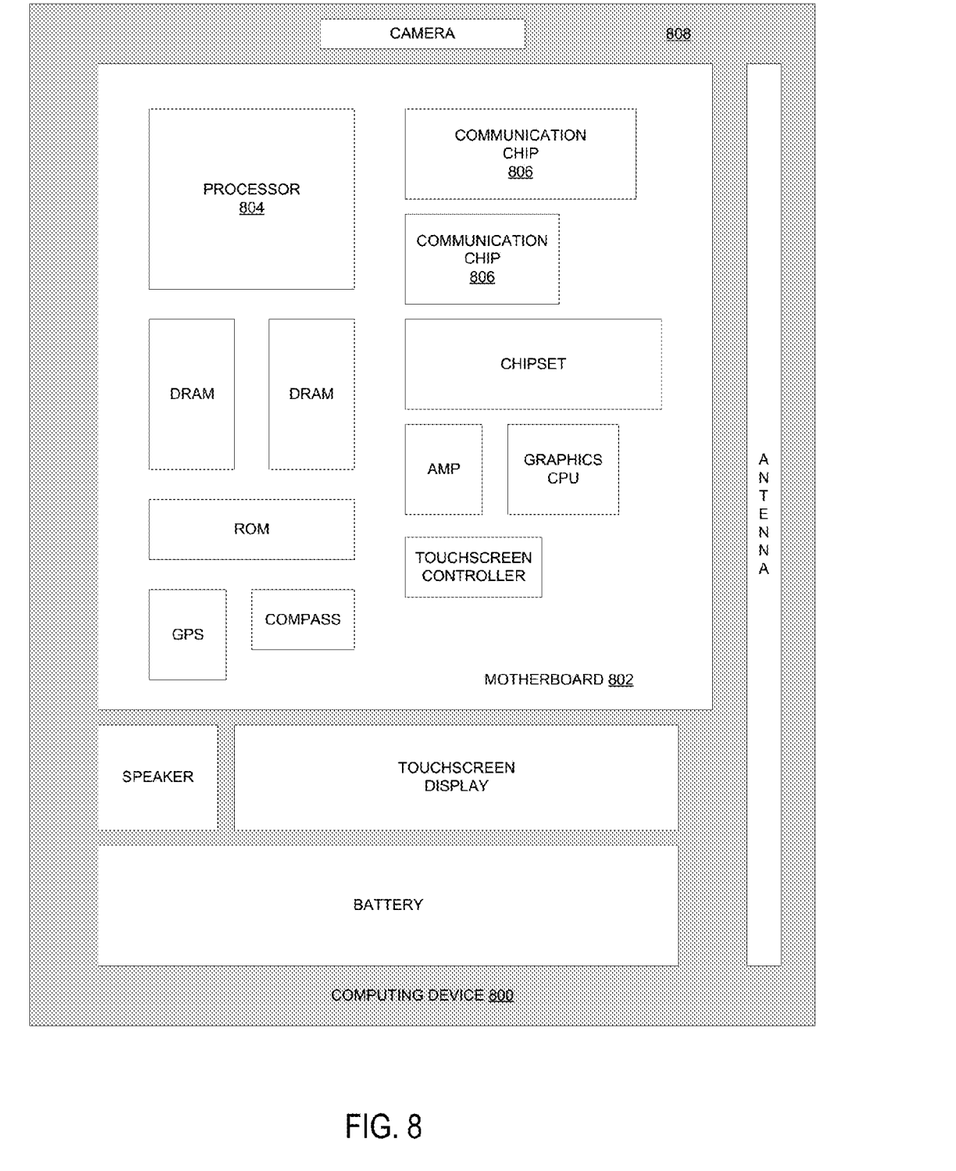
FIG. 8 schematically illustrates a computing device that includes an IC package assembly as described herein, in accordance with some embodiments.

Embodiments of the present disclosure may be implemented into a system using any suitable hardware and/or software to configure as desired. FIG. 8 schematically illustrates a computing device 800 that includes an IC package assembly (e.g., IC package assembly 100 or 200 of respective FIG. 1 or 2) as described herein, in accordance with some embodiments. The computing device 800 may house a board such as motherboard 802 (e.g., in housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may be packaged in an IC package assembly (e.g., IC package assembly 100 or 200 of respective FIG. 1 or 2) as described herein. For example, the circuit board 102 of FIG. 1 or 2 may be a motherboard 802 and the processor 804 may be a die of the die package 106 that is coupled with a socket assembly 104 mounted on the circuit board 102 according to techniques and configurations described herein (e.g., using positioning of electrical contact 500 or 600 of respective FIGS. 5a-b or 6). Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 806 may also include a die that may be packaged in an IC package assembly (e.g., IC package assembly 100 or 200 of respective FIG. 1 or 2) as described herein. In further implementations, another component (e.g., memory device or other integrated circuit device) housed within the computing device 800 may include a die that may be packaged in an IC package assembly (e.g., IC package assembly 100 or 200 of respective FIG. 1 or 2) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

EXAMPLES

According to various embodiments, the present disclosure describes an electrical contact for use in an integrated circuit (IC) package assembly. Example 1 of an electrical contact may include a leg portion configured to extend in a first direction, a foot portion coupled with the leg portion, the foot portion having a surface that extends in a second direction that is substantially perpendicular to the first direction, the surface being configured to directly couple with solderable material to form a solder joint, a heel portion adjoining the leg portion and the foot portion, the heel portion having a profile shape, and a toe portion extending from the foot portion and disposed opposite to the heel portion, the toe portion having a profile shape that is symmetric with the profile shape of the heel portion. Example 2 may include the electrical contact of Example 1, wherein the profile shape of the heel portion and the toe portion is curved. Example 3 may include the electrical contact of Example 1, wherein the electrical contact is a J-lead contact. Example 4 may include the electrical contact of Example 1, wherein the electrical contact is configured for use in a land-grid array (LGA) socket assembly. Example 5 may include the electrical contact of any of Examples 1-4, wherein a first portion of the surface of the foot portion extends in a third direction that is substantially perpendicular to the first direction and the second direction, a second portion of the surface of the foot portion extends in a fourth direction that is opposite to the third direction, and a distance between a terminating edge of the first portion and the heel portion is greater than a distance between a terminating edge of the second portion and the heel portion. Example 6 may include the electrical contact of any of Examples 1-4, further comprising a contact portion extending from the leg portion and configured to form an electrical connection with a die package, wherein the electrical contact is configured to route ground or input/output (I/O) signals of the die.

According to various embodiments, the present disclosure describes a method of forming a solder joint. Example 7 of a method may include providing an electrical contact comprising a leg portion configured to extend in a first direction, a foot portion coupled with the leg portion, the foot portion having a surface that extends in a second direction that is substantially perpendicular to the first direction, a heel portion adjoining the leg portion and the foot portion, the heel portion having a profile shape, and a toe portion extending from the foot portion and disposed opposite to the heel portion, the toe portion having a profile shape that is symmetric with the profile shape of the heel portion, bringing the surface of the foot portion into contact with solderable material, and performing a reflow process to form a solder joint between the solderable material and the surface, wherein during the reflow process, the molten solderable material equally wets the heel portion and the toe portion. Example 8 may include the method of Example 7, wherein the profile shape of the heel portion and the toe portion is curved. Example 9 may include the method of Example 7, wherein the electrical contact is a J-lead contact. Example 10 may include the method of Example 7, wherein the electrical contact is configured for use in a land-grid array (LGA) socket assembly. Example 11 may include the method of any of Examples 7-10, wherein a first portion of the surface of the foot portion extends in a third direction that is substantially perpendicular to the first direction and the second direction, a second portion of the surface of the foot portion extends in a fourth direction that is opposite to the third direction, a distance between a terminating edge of the first portion and the heel portion is greater than a distance between a terminating edge of the second portion and the heel portion, and performing the solder reflow process, wherein during the reflow process, a center of gravity of the molten solderable material shifts to a position that is equidistant to the terminating edge of the first portion and the terminating edge of the second portion. Example 12 may include the method of any of Examples 7-10, further comprising a contact portion coupled with the leg portion and configured to form an electrical connection with a die package, wherein the electrical contact is configured to route ground or input/output (I/O) signals of the die.

According to various embodiments, the present disclosure describes an integrated circuit (IC) package assembly (e.g., a socket assembly). Example 13 of an IC package assembly may include a substrate having a plurality of openings disposed between a first side and opposing second side of the substrate and a plurality of electrical contacts physically coupled with the substrate in corresponding openings of the plurality of openings, wherein individual electrical contacts of the plurality of electrical contacts each include a leg portion configured to extend in a first direction, a foot portion coupled with the leg portion, the foot portion having a surface that extends in a second direction that is substantially perpendicular to the first direction, the surface being configured to directly couple with solderable material to form a solder joint, a heel portion adjoining the leg portion and the foot portion, the heel portion having a profile shape, and a toe portion extending from the foot portion and disposed opposite to the heel portion, the toe portion having a profile shape that is symmetric with the profile shape of the heel portion. Example 14 may include the IC package assembly of Example 13, wherein the substrate includes two or more discrete portions, each of the two or more discrete portions includes at least one of the plurality of electrical contacts disposed in an opening of the plurality of openings. Example 15 may include the IC package assembly of Example 13, wherein the substrate is part of a socket assembly. Example 16 may include the IC package assembly of Example 13, further comprising a die electrically coupled with the plurality of electrical contacts. Example 17 may include the IC package assembly of Example 16, wherein the die is housed in a die package that is electrically coupled with the electrical contacts. Example 18 may include the IC package assembly of Example 13, wherein the pluralities of electrical contacts are in a land-grid array (LGA) configuration. Example 19 may include the IC package assembly of any of Examples 13-18, wherein a first portion of the surface of the foot portion extends in a third direction that is substantially perpendicular to the first direction and the second direction, a second portion of the surface of the foot portion extends in a fourth direction that is opposite to the third direction, and a distance between a terminating edge of the first portion and the heel portion is greater than a distance between a terminating edge of the second portion and the heel portion. Example 20 may include the IC package assembly of any of Examples 13-18, further comprising a contact portion coupled with the leg portion and configured to form an electrical connection with a die package, wherein the electrical contact is configured to route ground or input/output (I/O) signals of the die.

According to various embodiments, the present disclosure describes a system (e.g., a computing device). Example 21 of a computing device may include a circuit board, a socket assembly coupled with the circuit board, the socket assembly comprising a substrate having a plurality of openings disposed between a first side and opposing second side of the substrate, and a plurality of electrical contacts physically coupled with the substrate in corresponding openings of the plurality of openings, wherein individual electrical contacts of the plurality of electrical contacts each include a leg portion configured to extend in a first direction, a foot portion coupled with the leg portion, the foot portion having a surface that extends in a second direction that is substantially perpendicular to the first direction, the surface being directly coupled with solderable material to form a solder joint between the circuit board and the socket assembly, a heel portion adjoining the leg portion and the foot portion, the heel portion having a profile shape, and a toe portion extending from the foot portion and disposed opposite to the heel portion, the toe portion having a profile shape that is symmetric with the profile shape of the heel portion. Example 22 may include the computing device of Example 21, further comprising a die package electrically coupled with the plurality of electrical contacts. Example 23 may include the computing device of any of Examples 21-22, wherein the computing device is a mobile computing device including one or more of a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of forming a solder joint, the method comprising:

providing an electrical contact comprising:
a leg portion extending in a first direction,
a foot portion coupled with the leg portion, the foot portion having a surface that extends in a second direction that is substantially perpendicular to the first direction, a first portion of the surface of the foot portion extending in a third direction that is substantially perpendicular to the first direction and the second direction, and a second portion of the surface of the foot portion extending in a fourth direction that is opposite to the third direction,
a heel portion adjoining the leg portion and the foot portion, the heel portion having a profile shape, wherein a distance between a terminating edge of the first portion of the foot portion and the heel portion is greater than a distance between a terminating edge of the second portion of the foot portion and the heel portion, and a toe portion extending from the foot portion and disposed opposite to the heel portion, the toe portion having a profile shape that is symmetric with the profile shape of the heel portion;

bringing the surface of the foot portion into contact with solderable material; and performing a reflow process to form a solder joint between the solderable material and the surface, wherein during the reflow process, the solderable material equally wets the heel portion and the toe portion, and a center of gravity of the solderable material shifts to a position that is equidistant to the terminating edge of the first portion and the terminating edge of the second portion.

2. The method of claim 1, wherein the profile shape of the heel portion and the toe portion is curved.

3. The method of claim 1, wherein the electrical contact is a J-lead contact.

4. The method of claim 1, wherein the electrical contact is to be provided in a land-grid array (LGA) socket assembly, to route electrical signals in an integrated circuit package assembly that includes the LGA socket assembly.

5. The method of claim 1, further comprising:
a contact portion coupled with the leg portion, to form an electrical connection with a die package, wherein the electrical contact is to route ground or input/output (I/O) signals of the die package.

6. A method of forming a solder joint, the method comprising:

providing an electrical contact comprising:
a leg portion, extending in a first direction,
a foot portion coupled with the leg portion, the foot portion having a surface that is substantially perpendicular to the first direction,
a heel portion adjoining the leg portion and the foot portion, the heel portion having a profile shape, and
a toe portion extending from the foot portion and disposed across the surface opposite the heel portion, the toe portion including a profile shape that is symmetric with the profile shape of the heel portion, wherein:
the surface of the foot portion extends from the heel portion to the toe portion in a second direction and includes first and second opposed terminating edges that extend substantially parallel to the second direction; and
a first distance between the heel portion and the first terminating edge is greater than a second distance between the heel portion and the second terminating edge;

bringing the surface of the foot portion into contact with solderable material; and performing a reflow process to form a solder joint between the solderable material and the surface.

7. The method of claim 6, wherein the profile shape of the heel portion and the toe portion is curved.

8. The method of claim 6, wherein the electrical contact is a J-lead contact.

9. The method of claim 6, wherein the electrical contact is to be provided in a land-grid array (LGA) socket assembly, to route electrical signals in an integrated circuit package assembly that includes the LGA socket assembly.

10. The method of claim 6, wherein during the reflow process, a center of mass of the solderable material shifts to a position that is equidistant to the first and second terminating edges.

11. The method of claim 6, wherein the electrical contact further includes a contact portion coupled with the leg portion, to form an electrical connection with a die package, wherein the electrical contact is to route ground or input/output (I/O) signals of the die package.

12. The method of claim 6, wherein during the reflow process, the solderable material equally wets the heel portion and the toe portion.

13. A method of forming a solder joint, the method comprising:

providing an electrical contact comprising:
a leg portion extending in a first direction,
a foot portion coupled with the leg portion, the foot portion having a surface that is substantially perpendicular to the first direction,
a heel portion adjoining the leg portion and the foot portion, the heel portion having a profile shape, and
a toe portion extending from the foot portion and disposed across the surface opposite the heel portion, the toe portion including a profile shape that is symmetric with the profile shape of the heel portion, wherein:
the surface of the foot portion extends from the heel portion to the toe portion in a second direction and includes first and second opposed terminating edges that extend substantially parallel to the second direction; and
a first distance between the heel portion and the first terminating edge is greater than a second distance between the heel portion and the second terminating edge;

bringing the surface of the foot portion into contact with solderable material; and performing a reflow process to form a solder joint between the solderable material and the surface, wherein during the reflow process, the solderable material equally wets the heel portion and the toe portion and a center of mass of the solderable material shifts to a position that is equidistant to the first and second terminating edges.

14. The method of claim 13, wherein the profile shape of the heel portion and the toe portion is curved.

15. The method of claim 13, wherein the electrical contact is a J-lead contact.

16. The method of claim 13, wherein the electrical contact is to be provided in a land-grid array (LGA) socket assembly, to route electrical signals in an integrated circuit package assembly that includes the LGA socket assembly.

17. The method of claim 13, wherein the electrical contact further includes a contact portion coupled with the leg portion, to form an electrical connection with a die package, wherein the electrical contact is to route ground or input/output (I/O) signals of the die package.

* * * * *